United States Patent
Lee

[11] Patent Number: 6,087,259
[45] Date of Patent: Jul. 11, 2000

[54] METHOD FOR FORMING BIT LINES OF SEMICONDUCTOR DEVICES

[75] Inventor: Sang Hyeob Lee, Kyoungki-do, Rep. of Korea

[73] Assignee: Hyundai Electronics Industries Co., Ltd., Kyoungki-do, Rep. of Korea

[21] Appl. No.: 08/863,148

[22] Filed: May 27, 1997

[30] Foreign Application Priority Data

Jun. 24, 1996 [KR] Rep. of Korea ............. 96-23261
Jun. 27, 1996 [KR] Rep. of Korea ............. 96-24267
Jun. 27, 1996 [KR] Rep. of Korea ............. 96-24274

[51] Int. Cl.$^7$ .................................................. H01L 21/44
[52] U.S. Cl. ........................ 438/681; 438/683; 438/685; 257/263; 257/764; 257/765; 257/767
[58] Field of Search ....................... 438/233, 253, 438/254, 396, 639, 612, 681, 683, 685; 257/263, 774, 765, 767

[56] References Cited

U.S. PATENT DOCUMENTS

| | | | |
|---|---|---|---|
| 5,462,895 | 10/1995 | Chen | 437/200 |
| 5,525,543 | 6/1996 | Chen | 437/190 |
| 5,702,970 | 12/1997 | Choi | 438/253 |
| 5,789,028 | 3/1997 | Zhao et al. | 427/255.2 |
| 5,792,691 | 6/1997 | Koga | 438/233 |
| 5,804,479 | 8/1996 | Aoki et al. | 438/253 |
| 5,854,104 | 1/1997 | Onishi et al. | 438/240 |
| 5,869,901 | 10/1996 | Kusuyama | 257/263 |
| 5,953,576 | 9/1997 | Choi | 438/3 |

FOREIGN PATENT DOCUMENTS 09148328  6/1997  Japan .

*Primary Examiner*—Charles Bowers
*Assistant Examiner*—Reneé R. Berry
*Attorney, Agent, or Firm*—Nath & Associates; Gary M. Nath; Gregory B. Kang

[57] ABSTRACT

A bit line of a semiconductor device capable of obtaining low line resistance and low contact resistance, thereby achieving an improvement in the operating speed and reliability of the semiconductor device. The bit line has a multilayer structure including a Ti film, an MOCVD-TiN film and a W film sequentially formed over the semiconductor substrate. The MOCVD-TiN film serves as a diffusion barrier to suppress a reaction of tungsten, which forms the bit line, with silicon existing on a contact region during a thermal process at a high temperature such as a BPSG reflow.

6 Claims, 1 Drawing Sheet

METHOD FOR FORMING BIT LINES OF SEMICONDUCTOR DEVICES

BACKGROUND OF THE INVENTION

1. Field of the Invention

The present invention relates to bit lines of a semiconductor device and a method for forming such bit lines, and more particularly, to bit lines of a semiconductor device having a Ti/CVD-TiN/W multilayer structure and a method for forming such bit lines.

2. Description of the Prior Art

Typically, bit lines of semiconductor devices are made of tungsten (W) exhibiting a high melting point and a low specific resistance. By virtue of the use of such a material, it is possible to achieve an increase in signal transmission rate and to use elongated bit lines. Accordingly, an increase in the design margin of semiconductor devices is obtained.

Conventionally, a double thin film consisting of a polysilicon film and a tungsten silicide (WSix) film has been used for bit lines of semiconductor devices in order to compensate for the high resistance exhibited in polysilicon. The polysilicon thin film exhibits a specific resistance of 1,000 $\mu\Omega$ cm or less at a thickness of 1,000 Å whereas the tungsten silicide thin film exhibits a specific resistance of 700 $\mu\Omega$ cm or less. As a result, bit lines comprised of such a double thin film exhibit a more or less high resistance.

Where such bit lines are used for semiconductor devices which have an increased integration degree resulting in a reduction in line width, the resistance thereof increases, so that the signal transmission rate is limited. For this reason, it is necessary to use a metal exhibiting a very low specific resistance for bit lines in the fabrication of highly integrated semiconductor devices.

Such a problem can be solved by using a tungsten thin film which is formed in accordance with a chemical vapor deposition (CVD) method. This is because such a tungsten thin film exhibits a very low specific resistance ranging from 10 $\mu\Omega$ cm to 20 $\mu\Omega$ cm, and a superior step coverage capable of burying bit line contacts. However, such a CVD-W thin film results in an increase in contact resistance by 50% or more. The CVD-W thin film also causes damage to the semiconductor device when it is subjected to a thermal process such as a boro phosphor silicate glass (BPSG) reflow after its line formation. For this reason, a diffusion barrier should be used in order to suppress a reaction for forming tungsten silicide. A representative diffusion barrier material is titanium nitride (TiN). In terms of the forming method used for the diffusion barrier, such titanium nitride is classified into CVD-TiN and sputtered TiN. The CVD-TiN exhibits a superior diffusion barrier characteristic over the sputtered TiN. However, the CVD-TiN absorbs impurities, such as moisture and oxygen, existing in the atmosphere, thereby forming an oxide as an insulating layer on contacts in a subsequent process carried out at a high temperature.

SUMMARY OF THE INVENTION

In order to use tungsten for bit lines, it is necessary to use a diffusion barrier serving to suppress a reaction between tungsten and silicon at contact regions when a thermal process at a high temperature such as a BPSG reflow is carried out after the formation of bit lines. The reaction between tungsten and silicon can be completely prevented by the use of TiN produced using tetrakis dimethyl amino titanium (TDMAT) and tetrakis diethyl amino titanium (TDEAT) in accordance with a CVD process. Hereinafter, such TiN is called "MOCVD-TiN".

Therefore, an object of the invention is to solve the above-mentioned problem and to provide bit lines of a semiconductor device which have a Ti/TiN/W multilayer structure.

Another object of the invention is to provide a method for forming bit lines of a semiconductor device having a Ti/TiN/W multilayer structure.

In accordance with one aspect of the present invention, a bit line of a semiconductor device connected to a semiconductor substrate of the semiconductor device at a contact region is provided, said the bit line having: a multilayer structure comprising a Ti film, an MOCVD-TiN film and a W film sequentially formed over the semiconductor substrate.

In accordance with another aspect of the present invention, a method for forming a bit line of a semiconductor device which is in contact with a semiconductor substrate of the semiconductor device is provide and comprises the steps of: forming an insulating film over the semiconductor substrate; etching a portion of the insulating film, thereby forming a contact hole for partially exposing the semiconductor substrate; sequentially forming a Ti film, an MOCVD-TiN film and a W film over the entire exposed surface of the resulting structure obtained after the formation of the contact hole; and patterning the Ti, MOCVD-TiN and W films, thereby forming a bit line having a multilayer structure comprised of the patterned Ti, MOCVD-TiN and W films.

The MOCVD-TiN film serves as a diffusion barrier to prevent $WSi_2$ from being formed due to a reaction of W with Si existing at the contact region.

Since the MOCVD-TiN film is a thin film having an amorphous structure, it exhibits superior diffusion barrier over a sputtered TiN film having a columnar crystalline structure. The MOCVD-TiN film also exhibits superior step coverage, so that it is small in thickness.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
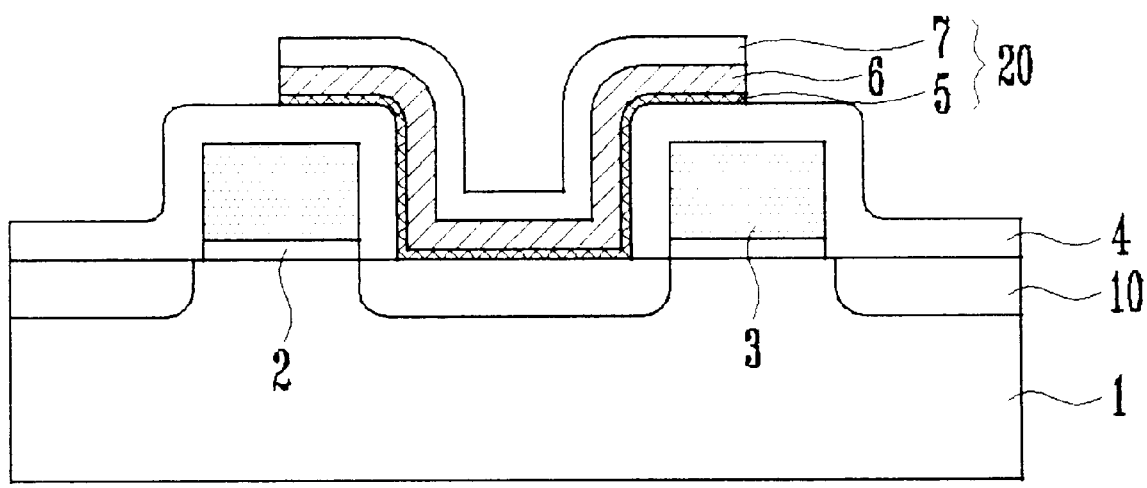
FIG. 1 is a sectional view illustrating a bit line of a semiconductor device formed in accordance with the present invention to have a multilayer structure consisting of a Ti film, an MOCVD TiN film and a W film.

Referring to FIG. 1, a bit line formed in accordance with the present invention is illustrated. FIG. 1 shows a state in which the bit line is in contact with a diffusion region, such as a source or drain region, defined between word lines on a semiconductor substrate. For the reference, the process of forming the bit line will be described in conjunction with FIG. 1. First, a gate oxide film 2 and word lines 3 are sequentially formed on a semiconductor substrate 1. Thereafter, impurity ions are implanted in portions of the semiconductor substrate 1 respectively corresponding to active regions, thereby forming source/drain regions 10. An interlayer insulating film 4 is then formed over the entire exposed surface of the resulting structure. The interlayer insulating film 4 is then etched at its portion corresponding to a contact region, thereby exposing the diffusion region 10 corresponding to the contact region. Subsequently, the formation of the bit line is carried out. In FIG. 1, the bit line is denoted by the reference numeral 20.

The formation of the bit line 20 is carried out in accordance with the present invention. That is, a Ti film 5, an MOCVD-TiN film 6 and a W film 7 are sequentially formed over the resulting structure obtained after etching the interlayer insulating film 4 and then patterned by an etch process using a mask.

The Ti film 5 is deposited to a thickness of 50 to 1,000 Å. The MOCVD-TiN film 6 is deposited to a thickness of 50 to 1,000 Å using a TDMAT or TDEAT in accordance with a CVD process. The W film 7 is deposited to a thickness of 500 to 5,000 Å in accordance with the CVD process.

After the deposition of the Ti film 5 or the deposition of the MOCVD-TiN 6, a rapid thermal annealing may be performed at a temperature of 500 to 1,000° C. for 5 to 60 seconds in a nitrogen atmosphere. In this case, a uniform $TiSi_2$ having a $C_{49}$ structure is formed on the bottom of the contact, thereby suppressing a formation of voids on the bottom of the contact. It is also possible to prevent the silicon at the contact region from reacting with moisture absorbed in the MOCVD-TiN film. Accordingly, a low contact resistance is obtained. It is also possible to reduce leakage current.

Alternatively, a sputtered TiN film and an MOCVD-TiN film may be sequentially formed over the TiN film 5. The W film 8 is deposited over the MOCVD-TiN film. In this case, the bit line 20 exhibits a low and stable contact resistance. Accordingly, it is possible to improve the productivity and reliability of a semiconductor device finally produced.

In contrast, an MOCVD-TiN film, which is processed by plasma, may be deposited in place of the sputtered TiN. In this case, no absorption of impurities from the atmosphere is carried out in the plasma-processed MOCVD-TiN film because this film is a thin film having a tight structure. That is, the plasma-process MOCVD-TiN thin film has an effect similar to that of the sputtered TiN film which serves as a diffusion barrier.

The bit line 20 may also be comprised of the Ti film 5, MOCVD-TiN film 6, W film 7 and a TiN film. In this case, the TiN film has a thickness of 100 to 1,000 Å and serves as an anti-reflection coating layer.

As is apparent from the above description, the present invention uses a MOCVD-TiN film as a diffusion barrier adapted to suppress a reaction of tungsten, which forms a bit line, with silicon existing on a contact region during a thermal process at a high temperature such as a BPSG reflow. In this case, a superior effect is obtained.

In accordance with the present invention, bit lines have a multilayer structure consisting of a Ti film, an MOCVD-TiN film and a W film, a multilayer structure consisting of a Ti film, a sputtered TiN film, an MOCVD-TiN film not processed by plasma, and a W film, a multilayer structure consisting of a Ti film, a plasma-processed MOCVD-TiN film, an MOCVD-TiN film not processed by plasma, and a W film, or a multilayer structure consisting of a Ti film, an MOCVD-TiN film, a W film and an anti-reflection coating TiN film. By virtue of such a multilayer structure, it is possible not only to considerably reduce the line resistance of bit lines, but also to stably obtain a low contact resistance of bit lines to an associated semiconductor substrate. Accordingly, an improvement in the operating speed and reliability of the semiconductor device finally produced is achieved.

Where a rapid thermal annealing is carried out in the formation of bit lines, an improvement in the stability of bit lines is obtained.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a bit line of a semiconductor device which is in contact with a semiconductor substrate of the semiconductor device, comprising the steps of:

forming an insulating film over the semiconductor substrate;

etching a portion of the insulating film, thereby forming a contact hole for partially exposing the semiconductor substrate;

forming a Ti film over the entire exposed surface of the resulting structure obtained after the formation of the contact hole;

forming a first MOCVD-TiN film over the Ti film;

plasma-treating the first MOCVD-TiN film to form a plasma treated first MOCVD-TiN film;

forming a second MOCVD-TiN film over an entire surface of the resulting structure;

forming a W film on the second MOCVD-TiN film; and patterning the Ti film, the plasma treated first MOCVD-TiN film and the second MOCVD-TiN, thereby forming a bit line.

2. The method in accordance with claim 1, wherein the first and second MOCVD-TiN films are formed in accordance with a chemical vapor deposition method using tetrakis dimethyl amino titanium or tetrakis diethyl amino titanium.

3. The method in accordance with claim 1, further comprising the step of carrying out a rapid thermal annealing at a temperature of 500 to 1000° C. for 5 to 60 seconds in a nitrogen atmosphere for the structure obtained after the formation of the Ti film.

4. The method in accordance with claim 1, wherein the Ti film has a thickness of 50 to 1,000 Å and the W film has a thickness of 500 to 5,000 Å.

5. A method for a bit line of a semiconductor device which is in contact with a semiconductor substrate of the semiconductor device, comprising the steps of:

forming an insulating film over the semiconductor substrate;

etching a portion of the insulating film, thereby forming a contact hole for partially exposing the semiconductor substrate;

forming a Ti film over an entire surface of the resulting structure;

depositing a sputtered TiN film over the Ti film;

forming a MOCVD-TiN film over the sputtered TiN film;

forming a W film over the MOCVD-TiN film; and patterning Ti film, the sputtered TiN film, the MOCVD-TiN and the W film, thereby forming a bit line.

6. The method in accordance with claim 1, wherein the rapid thermal annealing treatment is carried out after the formation of the MOCVD-TiN film.

* * * * *

UNITED STATES PATENT AND TRADEMARK OFFICE
CERTIFICATE OF CORRECTION

PATENT NO.   : 6,087,259
DATED        : January 11, 2000
INVENTOR(S)  : Sang H Lee It is certified that error appears in the above-identified patent and that said Letters Patent is hereby corrected as shown below:

Claim 4,
Line 1, change "1" to -- 3 --.

Claim 6,
Line 1, change "1" to -- 3 --.

Signed and Sealed this

Seventh Day of August, 2001

Attest:

NICHOLAS P. GODICI
Attesting Officer    Acting Director of the United States Patent and Trademark Office